United States Patent [19]

Schuster et al.

[11] 3,840,982

[45] Oct. 15, 1974

[54] CONTACTS FOR SEMICONDUCTOR DEVICES, PARTICULARLY INTEGRATED CIRCUITS, AND METHODS OF MAKING THE SAME

[75] Inventors: Marvin A. Schuster, Baltimore; Walter J. Lytle, Catonsville, both of Md.

[73] Assignee: Westinghouse Electric Corporation, Pittsburgh, Pa.

[22] Filed: Aug. 14, 1969

[21] Appl. No.: 850,136

Related U.S. Application Data

[62] Division of Ser. No. 605,394, Dec. 28, 1966, abandoned.

[52] U.S. Cl. .................. 29/578, 29/591, 217/212

[51] Int. Cl. .................. B01j 17/00

[58] Field of Search .......... 29/578; 156/11, 13, 17

[56] References Cited

UNITED STATES PATENTS

| | | | |
|---|---|---|---|
| 2,981,877 | 4/1961 | Noyce | 29/578 UX |
| 3,270,256 | 8/1966 | Mills | 317/234 |
| 3,380,155 | 4/1968 | Burks | 29/591 |
| 3,436,809 | 4/1969 | Peacock | 29/578 |

OTHER PUBLICATIONS

IBM Technical Disclosure Bulletin, "Lands for Planar Silicon Devices," Ames & Cheroff, Vol. 8, No. 4., Sept. 1965, pp. 646, 647.

*Primary Examiner*—Roy Lake
*Assistant Examiner*—W. Tupman
*Attorney, Agent, or Firm*—C. L. Menzemer

[57] ABSTRACT

The metal used for device contacts and for interconnections is separated from the bonding pad to which a lead wire is joined by highly doped semiconductive material that provides a conducting connection but avoids metallic contact therebetween. Aluminum may be used for contacts and interconnections while gold may be used for bonding pads and lead wires without being subject to purple plague. Methods of fabrication include particular sequences of selective deposition and/or selective removal of metal layers employing masks such as of photoresist material.

The invention described herein was made in the performance of work under a NASA contract and is subject to the provisions of Sect. 305 of the National Aeronautics and Space Act of 1958, Public Law 85-568 (72 Stat. 435; 42 U.S.C. 2457).

7 Claims, 3 Drawing Figures

PATENTED OCT 15 1974

3,840,982

WITNESSES

Theodore F. Wrobel

James F. Young

INVENTORS
Marvin A. Schuster
and Walter J. Lytle

BY C. L. Menzemer

ATTORNEY

CONTACTS FOR SEMICONDUCTOR DEVICES, PARTICULARLY INTEGRATED CIRCUITS, AND METHODS OF MAKING THE SAME

RELATED APPLICATIONS

This application is a division of application Ser. No. 605,394, filed Dec. 28, 1966, and now abandoned.

FIELD OF THE INVENTION

This application is directed to semiconductor devices and, particularly, to a contacting technique especially advantageous for integrated circuits while avoiding causes of failure inherent in prior art systems.

DESCRIPTION OF PRIOR ART

The usual approach to fabricating contacts on silicon planar integrated circuits involves the use of a first metal, such as aluminum, for contact to the semiconductor material and also for conductive interconnections that extend over an insulating layer disposed on the semiconductor body. Bonding pads, usually at the periphery of the integrated circuit, are provided as part of the interconnection pattern for attachment of a lead wire that is joined at its other end to the more massive package leads. The lead wire is usually gold.

There is degradation of the prior art system due to the gradual formation of a series of gold-aluminum intermetallic compounds at the interface between the aluminum bonding pads and the gold wire. These intermetallic compounds include $AuAl_2$, AuAl, $Au_2Al$, $Au_5Al_2$ and $Au_4Al$. These compounds are dark, sometimes purplish, and their occurrence is often referred to as "purple plague." Since these compounds vary in conductivity and are less conductive than the pure metals they gradually increase the resistance of the bond and eventually may form an open circuit due to the volumetric mismatch between the various components of the assemblage. The wire may in fact separate from the pad.

The rate of formation of these compounds is a function of pressure, as applied during the wire bonding operation, and temperature and time, both during bonding and in storage or actual operation. Consequently, overall device reliability is severely impaired and becomes difficult to control or predict. Where a large number of bonds are required to be made to an integrated circuit, elevated temperatures that accelerate purple plague may be encountered during the extended time period required to complete the large number of bonds.

It is an object of the present invention to provide an improved contacting system for semiconductor devices, particularly integrated circuits, that avoids the above-mentioned failure mechanisms but is easily practiced in accordance with existing technology.

SUMMARY OF THE INVENTION

The invention, briefly, achieves the above-mentioned and additional objects and advantages by a system, and method, wherein the metal used for device contacts and interconnections is separated from the bonding pad and wire by highly doped semiconductive material that provides a conductive connection but avoids metallic contact therebetween. This invention not only improves the aluminum contact-gold wire system now used, it also provides greater freedom of choice in the selection of conductors for use with various semiconductors.

DESCRIPTION OF DRAWINGS

The invention will be better understood by referring to the following description taken with the accompanying drawing, wherein.

DESCRIPTION OF PREFERRED EMBODIMENTS

Figure 1:
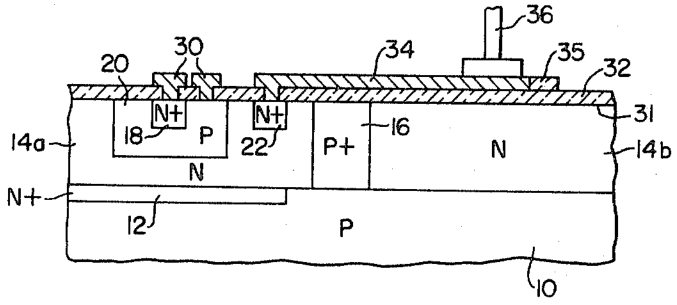
PRIOR ART FIG. 1.
FIG. 1 is a partial sectional view of a semiconductor integrated circuit in accordance with the prior art.

Referring to FIG. 1, an integrated circuit structure is shown comprising a P-type substrate 10, an N+ floating collector region 12 in the surface of the substrate, an epitaxial layer divided into portions **14*a* and 14*b* by a P+ isolation wall 16 extending therethrough. In one portion 14*a* of the epitaxial layer the remaining regions of a bipolar transistor structure are provided, merely by way of example. These regions include an emitter region 18, a base region 20 and a collector contact region 22. Contacts 30 are illustrated bonded to the emitter, base and collector contact regions. Elsewhere the surface 31 of the integrated circuit is protected by a layer of insulating material 32,** such as one of silicon dioxide.

The emitter and base contacts would be connected by conductive interconnections, not shown, to other elements of the integrated circuit or to other bonding pads. Shown in FIG. 1, by way of example, is a conductive interconnection 34 joined to the collector contact and extending over the oxide layer to a removed portion, usually at the periphery of the integrated circuit, where it is more convenient to provide a bonding pad 35 of larger area than at the contact site itself. The isolation wall 16 isolates the illustrated transistor structure from other elements in the integrated circuit but is not necessary for isolation from material in the bonding pad area.

The conductive interconnection and pad material is the same as the contact material, usually aluminum. The composition of the contact and interconnection is selected for a combination of qualities that include ease of application with good adherence to the semiconductive material and the insulating layer.

Joined to the bonding pad 35 is a lead wire 36 that is ordinarily gold and consequently produces the problems discussed in the introduction hereto.

It has been found generally unsuccessful to provide the same metal, such as aluminum, for both contacts and wire bonds. Aluminum wire is difficult to bond due to the formation of a protective oxide about the tip of the wire. Also, the undesirable metallic compositions may be formed at package leads which are usually gold plated. On the other hand, gold interconnections are not used since vapor deposited gold does not adhere well to silicon dioxide.

The present invention avoids the problems of the prior art through a system that permits complete separation of any incompatible metals so that free choice may be made without encountering the formation of undesirable metallic compositions. By compatibility between metals it is meant that there is no appreciable formation of undesirable reaction products at temperatures and conditions ordinarily encountered in the final fabrication and packaging operations and in the use of integrated circuits such as below about 360° C.

Figure 2:
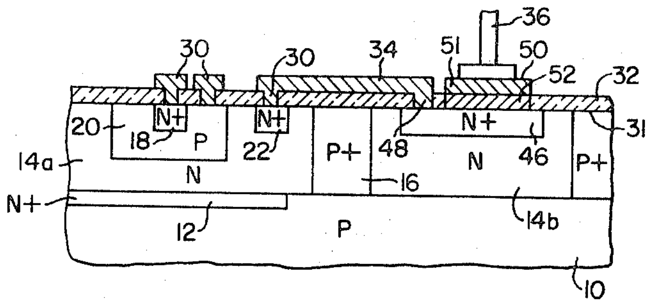
FIG. 2 is a partial sectional view of a semiconductor integrated circuit in accordance with the practice of this invention.
Figure 3:
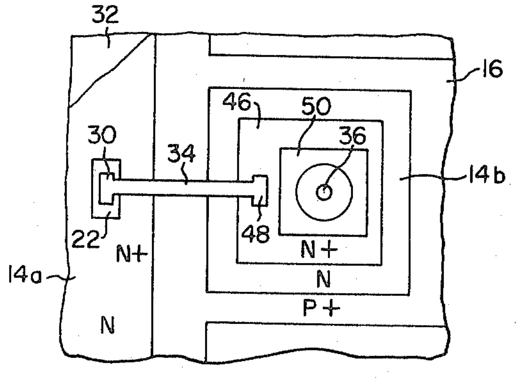
FIG. 3 is a partial plan view of the structure of FIG. 2.

FIGS. 2 and 3 illustrate an example of the present invention in a structure similar to that of FIG. 1 wherein the same reference numerals are used to designate elements corresponding to those of FIG. 1. The structure of FIGS. 2 and 3 differs in the nature and configuration of the bonding pad area from that of FIG. 1. Rather than being insulated from the semiconductor structure by the oxide layer 32 as in FIG. 1, the bonding pad of FIG. 2 is disposed in direct contact with a region 46 of semiconductive material. The region 46 is relatively highly doped and may conveniently be and preferably is formed in the same diffusion as for the emitter region 18 and collector contact region 22, thus having a surface concentration of approximately $10^{21}$ atoms per cubic centimeter.

A first contact 48 is made to the bonding pad region 46 of a first metal composition that is, most conveniently, the same as that used for the contacts 30 and interconnection 34, such as aluminum. A second contact 50 is made to the bonding pad region 46 of a second metal composition different than the first metal composition and is one that includes at least a first layer 51 consisting essentially of gold. The second contact is spaced and separated from the first contact but they are conductively interconnected by the material of the N+ region 46. As shown in FIG. 2, the first metal contacts 30 and interconnection 34 are free of any protective layer that does not also cover portions of the second contact 50.

The second contact may also comprise a very thin layer 52 of chromium that is in direct contact with the semiconductor material for the purpose of wetting the silicon; that is, it may be employed to provide better adherence to the silicon than would be provided by the gold layer 51 alone. The gold layer 51 provides a bonding pad for the gold lead wire 36 so that all the advantageous elements of the prior system are preserved. That is, the aluminum is retained for positive low resistance ohmic contact to the device elements while the gold lead wire is retained for sure contact in the bonding pad area. The gold or chromium-gold layer, even if having somewhat less adhesion to silicon than aluminum, is however, found sufficiently effective in the bonding pads which may be of relatively large area for satisfactory retention of the bond and for good conductivity to the degenerate silicon region 46.

The formation of the contact system may be carried out utilizing individually known planar diffusion, oxide masking, vapor deposition, sintering, and photoengraving techniques. Several different methods have been considered and tried in making the contact system in accordance with this invention. Various ones of these will be described of which one is strongly preferred.

Where it is desired to minimize the number of fabrication operations and utilize only gold for the second contact 50 it is possible to open a window through the oxide layer 32 and vapor deposit gold in the bonding pad area while the silicon wafer is held at the silicon-gold eutectic temperature of about 370° C. so that the gold will alloy to the silicon but will not adhere to the oxide. The gold can then be etched off the oxide in a standard photoresist masking operation. Application of the aluminum contacts and interconnections is then performed in a manner that is essentially the same as that presently used, however, an aluminum contact 48 will go directly to the bonding pad region 46 through a window in the oxide layer spaced from the gold pad 51. The final step of bonding gold wires 36 to the gold pads 51 is then performed in the manner as it is presently to aluminum bonding pad areas.

Where desired to improve the adherence of the second contact 50 in the bonding pad area through the use of an additional metal, such as chromium, that is more adherent than gold to silicon, that contact may be formed by first opening all the contact windows including those to the device elements for contacts 30 as well as for contacts 48 and 50 in the bonding pad region 46, and then evaporating successively layers of chromium and gold over the entire surface. The metal layers are then selectively removed everywhere except in the bonding pad areas 50 using an etchant such as six parts glycerine, three parts concentrated hydrochloric acid, one part concentrated nitric acid for the gold and a saturated solution of potassium ferrocyanide for the chromium and a photoresist mask. Subsequently, a layer of aluminum is evaporated over the entire surface and then by conventional photolithographic techniques it is selectively removed to provide the desired aluminum contacts and interconnections. An etchant, such as 25 parts phosphoric acid, five parts acetic acid, one part nitric acid is used, all normal concentrations, for the aluminum pattern that will not affect the gold layer.

Alternatively, there may be initially formed oxide layer windows only in the bonding pad areas. Then by successive vapor depositions, chromium and gold layers are formed over the entire surface in a single vacuum operation. Masking and etching using photolithographic techniques for removal of the chromium and gold layers in the aluminum contact window areas is then performed followed by an etch through the oxide for the aluminum contact areas. Following the formation of the oxide window pattern the remainder of the chromium-gold, or gold alone, if the additional metal layer is not employed, is etched except in the bonding pad areas following which normal aluminum deposition and selective removal is performed.

The foregoing techniques have deficiencies that make them not preferred for large scale use. For example, in methods that involve vapor deposition of aluminum over the entire surface including a previously formed gold bonding pad, subsequent etching of the aluminum may not remove all traces of aluminum from the bonding pad and wire bonding is affected. This may be avoided by having that area masked during aluminum depostion or masking all areas where aluminum is not ultimately desired. Another problem encountered in methods that involve aluminum contact formation after gold bonding pad formation is that the aluminum sintering temperature is well above the gold-silicon eutectic temperature. This results in the gold layer fusing well into the semiconductor and also results in deformation (crinkling) of the gold layer. This may be alleviated by a thick enough gold layer.

In contrast to the foregoing methods, the following is preferred because of fewer parameters that are difficult to control. That is, it is believed most readily reproduced and, hence, desirable for large scale manufacturing operations. By a photoresist masking and etching operation contact windows to the active elements and to the degenerately diffused conduction region are opened in the oxide layer 32. Aluminum is then vapor deposited across the entire substrate to a thickness of approximately 8,000 A. A photoresist masking and etching operation is then performed to retain only the desired contact interconnection pattern 34 (including the contacts 30 and 48 and interconnection 34 in the drawing). An etchant such as 25 parts phosphoric acid, five parts acetic acid, and one part nitric acid (all normal concentrations) is used. The metal is then sintered into the silicon to form contacts 30 and 48 by a 500° C, 15 minute thermal treatment in air. The succeeding operation is a photoresist masking and etching process to expose the windows for bonding pads 50. The photoresist mask is retained following this operation. The next process is a vapor deposition of a 10,000 A gold film (perhaps preceded by the vapor deposition of a thin, less than 600 A, chromium film which is used for wetting purposes only) through the windows in the photoresist mask to the semiconductive material. The excess metal, that which was deposited over the photoresist, is then "washed-out" by the removal of the photoresist. The pad metal is then sintered to a region 46 at 360° C for 15 minutes in air.

This procedure has the particular advantage of permitting individual, mutually exclusive, control over the sintering of the aluminum and gold contact pads to minimize contact resistance.

The final step of bonding gold wires 36 to the gold pads 50 is then performed in the manner as it is presently to aluminum bonding pad areas except that the temperature at which suitable bonds are made is raised from approximately 300° C for aluminum pads to aproximately 330° C for gold pads.

The present invention has been shown and described particularly in connection with the use of aluminum contacts and gold lead wires to silicon semiconductor devices. In its broader aspects, the invention pertains to the concept of utilizing any set of incompatible metals in a contact system wherein the material of the semiconductive body provides isolation between the metals yet completes the desired conductive path.

The avoidance of susceptibility to purple plague makes possible a wider choice of packaging operations and other post-bonding operations. In particular, it is now possible to carry out post-bonding (even post packaging) heat treatment for the purpose of charge stabilization of the surface of the component. Temperatures up to about 360° C (i.e., near the Au-Si eutectic temperature) may be employed for this purpose in the gold aluminum system.

The description herein includes by way of example a system employing gold lead wires. However, the nature of the conductive connection to the bonding pad is not so limited in the practice of this invention. For example, those techniques that involve joining more massive conductive members to the bonding pads, such as in beam lead technology, may employ the invention. Also, flip-chip technology where the "leads" are films on an insulating substrate may also be modified to take advantage of this invention.

In addition to integrated circuits employing a diffused isolation wall 16, as shown, the invention may be used on structures in which there is no internal isolation between elements or structures in which isolation is provided by some other means, such as by a layer of dielectric material.

The systems described wherein the contact and interconnection material is of one composition (e.g., aluminum) and the bonding pad and wire material is of another composition (e.g., chromium-gold with gold wire), each individual composition being stable, are preferred forms of the invention. However, an improvement over existing systems is provided by using the disclosed connecting region of highly doped semiconductive material even where bonding pads and lead wires react (e.g., aluminum pads and gold wires). In the prior art system, plague formation at the periphery of the gold wire bond can grow to the extent it severs the relatively narrow interconnection. Plague formation directly under the wire bond in the system of this invention is not likely to produce failure nearly as quickly. Plague formation at the periphery of the wire bond is now relatively tolerable. In its broader aspects the invention extends to the improvement described in this paragraph.

We claim:

1. A method of fabricating a semiconductor device comprising the steps of:

A. forming a plurality of conductivity regions adjoining a planar surface of a semiconductor structure with a layer of insulating material extending on said surface;

B. opening a first pattern of windows in said insulating layer to expose said semiconductor surface therein at a given conductivity region;

C. depositing a layer of a first metal on said insulating layer and said exposed semiconductor surface at said first pattern of windows;

D. selectively removing portions of said deposited metal layer to form a first metal pattern at least partially coincident with said first pattern of windows;

E. heating the first metal pattern to bond said first metal directly to said conductivity region of said semiconductor structure;

F. opening a second pattern of windows in said insulating layer by use of an apertured photoresist mask layer, said second windows being spaced from said first window pattern and said first metal pattern to expose said semiconductor surface at said given conductivity region;

G. retaining said photoresist mask layer on said insulating layer and said first metal pattern wherein the openings therein at least partially coincide with said second pattern of windows to leave exposed said semiconductor surface exposed by said second pattern of windows;

H. depositing at least a layer of a second metal uncompatible with said first metal over said photoresist mask layer and said exposed semiconductor surface at said second window pattern;

I. removing said photoresist layer and said second metal thereover to form a second metal pattern at least partially coincident with said second pattern of windows; and J. heating said second metal pattern to bond said second metal to said conductivity region of said semiconductor structure.

2. A method of fabricating a semiconductor device as set forth in claim 1 comprising the additional step of:

prior to depositing said layer of said second metal, depositing an auxiliary metal layer to provide better adhesion of said second metal to said semiconductor structure on said photoresist mask layer and said exposed semiconductor surface at said second pattern of windows; and wherein:

said second heating step bonds said auxiliary metal layer and said layer of said second metal thereover to said semiconductor structure.

3. A method of fabricating a semiconductor device as set forth in claim 1 wherein:

said layer of said second metal is deposited directly on said photoresist mask layer and said exposed semiconductor surface at said second pattern of windows; and said second heating step bonds said layer of second metal directly to said semiconductor structure.

4. A method of fabricating a semiconductor device comprising the steps of:

A. forming a plurality of conductivity regions adjoining a planar surface of a semiconductor device with a layer of insulating material extending on said surface;

B. opening a first pattern of windows in said insulating layer to expose said semiconductor surface therein at a given conductivity region;

C. depositing a layer of a first metal consisting essentially of aluminum on said insulating layer and said exposed semiconductor surface at said first pattern of windows;

D. selectively removing portions of said deposited aluminum layer to form a first metal pattern at least partially coincident with said first pattern of windows;

E. heating said first metal pattern to bond said first metal directly to said conductivity region of said semiconductor structure;

F. opening a second pattern of windows in said insulating layer by use of an apertured photoresist mask layer, said second windows being spaced from said first window pattern and said first metal pattern to expose said semiconductor surface at said given conductivity region;

G. retaining said photoresist mask layer on said insulating layer and said first metal pattern wherein the openings therein at least partially coincide with said second pattern of windows to leave exposed said semiconductor surface exposed by said second pattern of windows;

H. depositing at least a layer of a second metal comprising gold over said photoresist layer and said exposed semiconductor surface at said second window pattern;

I. removing said photoresist mask layer and said second metal deposited thereover to form a second metal pattern at least partially coincident with said second pattern of windows; and J. heating said second metal pattern to bond said second metal to said conductivity region of said semiconductor structure.

5. A method of fabricating a semiconductor device as set forth in claim 4 wherein:

said layer of said second metal deposited consists essentially of gold.

6. A method of fabricating a semiconductor device as set forth in claim 4 comprising the additional step of:

prior to depositing said layer of said second metal, depositing an auxiliary metal layer of chromium on said photoresist mask layer and said exposed semiconductor surface at said second pattern of windows; and wherein:

said second heating step bonds said auxiliary metal layer and said layer of second metal thereover to the semiconductor structure.

7. A method of fabricating a semiconductor device as set forth in claim 4 wherein:

said layer of said second metal is deposited directly on said photoresist mask layer and said exposed semiconductor surface at said second pattern of windows; and said second heating step bonds said layer of second metal directly to said semiconductor structure.

* * * * *